(12) United States Patent
Kunii et al.

(10) Patent No.: US 8,678,674 B2
(45) Date of Patent: Mar. 25, 2014

(54) OPTICAL TRANSCEIVER AND PRODUCTION METHOD THEREOF

(71) Applicant: Fujitsu Optical Components Limited, Kawasaki (JP)

(72) Inventors: Masaki Kunii, Yokohama (JP); Tsutomu Ohtsu, Hino (JP); Masami Kamioka, Tochigi (JP); Masanari Yamakita, Tama (JP)

(73) Assignee: Fujitsu Optical Components Limited, Kawasaki (JP)

( * ) Notice: Subject to any disclaimer, the term of this patent is extended or adjusted under 35 U.S.C. 154(b) by 0 days.

(21) Appl. No.: 13/674,471

(22) Filed: Nov. 12, 2012

(65) Prior Publication Data

US 2013/0156441 A1  Jun. 20, 2013

(30) Foreign Application Priority Data

Dec. 16, 2011 (JP) ................................ 2011-276388

(51) Int. Cl.
*G02B 6/42* (2006.01)
(52) U.S. Cl.
USPC .......................................................... 385/92
(58) Field of Classification Search
None
See application file for complete search history.

(56) References Cited

U.S. PATENT DOCUMENTS

| | | | | |
|---|---|---|---|---|
| 5,416,668 A | * | 5/1995 | Benzoni | 361/816 |
| 5,535,034 A | * | 7/1996 | Taniguchi | 398/139 |
| 7,153,043 B1 | * | 12/2006 | Zhang et al. | 385/92 |
| 7,309,173 B2 | * | 12/2007 | Epitaux et al. | 385/92 |
| 7,478,953 B2 | * | 1/2009 | Tanaka | 385/89 |
| 2005/0168957 A1 | * | 8/2005 | Kawauchi et al. | 361/749 |
| 2005/0259994 A1 | * | 11/2005 | Zhang et al. | 398/164 |
| 2009/0324238 A1 | | 12/2009 | Kunii et al. | |

FOREIGN PATENT DOCUMENTS

JP   11-177278 A   *   7/1999
JP   2010-8673         1/2010

* cited by examiner

*Primary Examiner* — Mike Stahl
(74) *Attorney, Agent, or Firm* — Staas & Halsey LLP

(57) ABSTRACT

An optical transceiver includes a single-fiber bidirectional optical transmission/reception device, a circuit board, a transmission-side FPC, a reception-side FPC and a separation wall. The optical transceiver includes a single-fiber bidirectional optical transmission/reception device includes an LD stem that converts an electric signal into an optical signal and transmits it, and a PD stem that receives the optical signal and converts it into an electric signal. The transmission-side FPC electrically connects the LD stem and the circuit board. The reception-side FPC electrically connects the PD stem and the circuit board. The separation wall is formed between the transmission-side FPC and the reception-side FPC, and grounded to the chassis of the optical transceiver. The reception-side FPC is folded and set between the chassis and the separation wall such that the board front surface is an inner side, where the micro-strip line is formed on the above board front surface.

6 Claims, 10 Drawing Sheets

OPTICAL TRANSCEIVER AND PRODUCTION METHOD THEREOF

CROSS-REFERENCE TO RELATED APPLICATION

This application is based upon and claims the benefit of priority of the prior Japanese Patent Application No. 2011-276388, filed on Dec. 16, 2011, the entire contents of which are incorporated herein by reference.

FIELD

The embodiment discussed herein is related to an optical transceiver and a production method for an optical transceiver.

BACKGROUND

In the related art, with development of communication techniques, an optical network that realizes high-speed transmission using an optical fiber has become popular. Normally, the optical network is configured with an OLT (Optical Line Terminal) as an optical transmission apparatus set on the common carrier side, an ONU (Optical Network Unit) as an optical subscriber apparatus set on the user side and an optical fiber cable connecting these. Although a plurality of schemes are applicable to the optical network, in view of simplification and lower cost of the network configuration, a PON (Passive Optical Network) scheme is generally adopted. The PON scheme realizes single-fiber bidirectional optical transmission and reception to transmit light in two directions between the OLT and the ONU by dividing one optical fiber by an optical splitter and wiring the result for the user.

A single-fiber bidirectional optical transceiver has a bidirectional optical transmission/reception device. The bidirectional optical transmission/reception device is connected to a circuit board via an FPC (Flexible Printed Circuit). In the bidirectional optical transmission/reception device, an LD (Laser Diode) for optical transmission and an APD (Avalanche Photo Diode) or PD (Photo Diode) for optical reception are mounted in one chassis. Especially, since an optical transceiver used for optical transmission in the PON scheme corresponds to single-fiber bidirectional optical transmission/reception, an FPC for transmission and an FPC for reception are mounted in the identical chassis.

[Patent Literature 1]
Japanese Laid-open Patent Publication No. 2010-008673

However, recently, in ITU (International Telecommunications Union), an XGPON scheme supporting higher-speed transmission of 10 Gbps than a GPON (Gigabit Passive Optical Network) scheme in the related art was standardized. In the XGPON scheme, a crosstalk between an electric signal of about 2.5 V flown in the FPC for transmission and a weak electric signal of about 10 mV flown in the FPC for reception becomes significant especially, and therefore it is difficult to maintain a miniature chassis while performing stable optical transmission/reception in the identical chassis. Also, at the time of connection between a PD for optical reception and a circuit board, there is a case where a micro-strip line formed on the front surface of an FPC for reception touches a wall surface of a chassis. Accordingly, a characteristic impedance set to a predetermined value (e.g. 50Ω) changes. Such an impedance change is a cause of degradation of optical transmission quality.

SUMMARY

According to an aspect of the embodiments, an optical transceiver includes: an optical transmission/reception device including a light emitting unit that converts an electric signal into an optical signal and transmits the optical signal, and a light receiving unit that receives the optical signal and converts the optical signal into an electric signal; a circuit board including a drive circuit and a signal processing circuit of the optical transmission/reception device; a first flexible printed circuit that electrically connects the light emitting unit and the circuit board; a second flexible printed circuit that electrically connects the light receiving unit and the circuit board; and a separation wall that is formed between the first flexible printed circuit and the second flexible printed circuit and grounded to a chassis of the optical transceiver, wherein the second flexible printed circuit is folded and set between the chassis and the separation wall such that a board front surface is an inner side, and a wiring pattern is formed on the board front surface and a signal ground pattern is formed on a rear surface.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Preferred embodiments will be explained with reference to accompanying drawings. Also, the optical transceiver and production method thereof disclosed in the present application are not limited to the following embodiments.

Figure 1A:
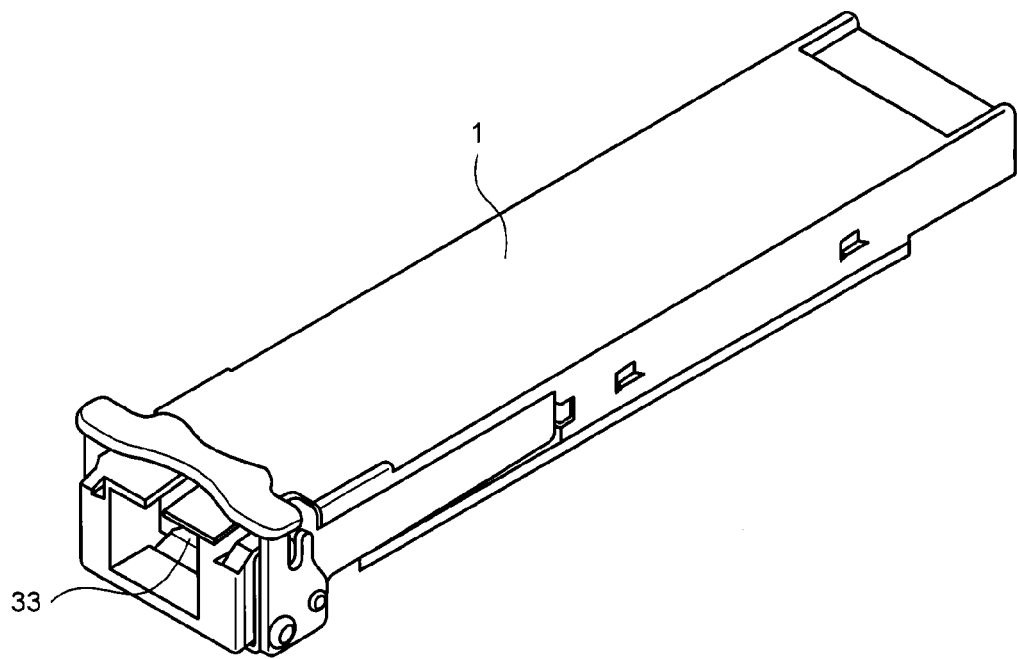
FIG. 1A is an outline perspective view of an optical transceiver according to the present embodiment.

First, a configuration of an optical transceiver according to an embodiment disclosed in the present application will be explained. FIG. 1A is an outline perspective view of an optical transceiver 1 according to the present embodiment. The optical transceiver 1 is used as a component of an optical module based on SFP (Small Form factor Pluggable) or XFP (SFP supporting 10 Gbps) which is a standard of an optical transceiver to connect an optical fiber to a communication apparatus. As illustrated in FIG. 1A, the optical transceiver 1 includes a connector unit 33 that is attachable to an optical fiber cable. Accordingly, an OLT as a station-side optical transmission apparatus mounting the above optical module can transmit/receive optical signals to/from an optical splitter in two directions via one optical fiber cable connected to the connector unit 33.

Figure 1B:
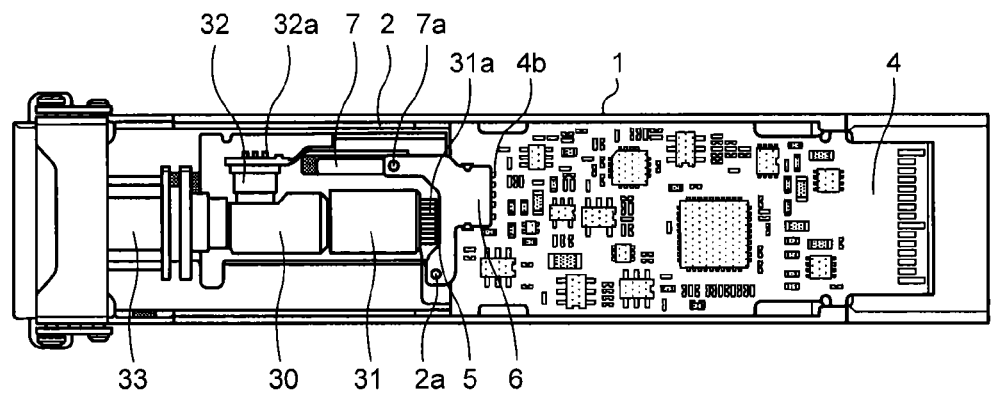
FIG. 1B is a front surface view illustrating the inside of a chassis of the optical transceiver according to the present embodiment.

FIG. 1B is a front surface view illustrating the inside of a chassis of the optical transceiver 1 according to the present embodiment. As illustrated in FIG. 1B, the optical transceiver 1 includes a chassis 2, a single-fiber bidirectional optical transmission/reception device 30, a circuit board 4, a transmission-side flexible printed circuit 5 (hereinafter referred to as "transmission-side FPC 5"), a reception-side flexible printed circuit 6 (hereinafter referred to as "reception-side FPC 6") and a separation wall 7.

The chassis 2 is formed with metal of higher workability and conductivity. The chassis 2 is formed with, for example, a stainless steel plate in which zinc plating or nickel plating is applied to the front surface. In the inside of the chassis 2, the single-fiber bidirectional optical transmission/reception device 30, the circuit board 4, the transmission-side FPC 5, the reception-side FPC 6 and the separation wall 7 are contained.

The single-fiber bidirectional optical transmission/reception device 30 is a device combining and integrating a laser diode (hereinafter referred to as "LD") for optical transmission and a photo diode (hereinafter referred to as "PD") for optical reception in one chassis. As the PD, for example, it is possible to use an avalanche photo diode (APD). The single-fiber bidirectional optical transmission/reception device 30 includes an LD stem 31 having a transmission-side lead terminal 31a, a PD stem 32 having a reception-side lead terminal 32a and the connector unit 33.

The LD stem 31 contains a light-emitting element such as an LD. The transmission-side lead terminal 31a is connected to an electrode terminal formed on the front surface of the circuit board 4. The PD stem 32 contains a light-receiving element such as a PD. The reception-side lead terminal 32a is connected to an electrode terminal formed on the rear-surface of the circuit board 4. The connector unit 33 contains a connector of an optical fiber (not illustrated) and connects between the optical transceiver 1 and an optical splitter (not illustrated). An electric signal for optical communication is converted into an optical signal by the LD contained in the LD stem 31 and subsequently transmitted to the optical fiber. The transmission-side lead terminal 31a for an LD extends from the LD stem 31 and is connected to a transmission-side electrode terminal 4a of the circuit board 4 via the transmission-side FPC 5. Meanwhile, an optical signal transmitted by the optical fiber is converted into an electric signal by the PD contained in the PD stem 32 and subsequently output. The reception-side lead terminal 32a for a PD extends from the PD stem 32 and is connected to a reception-side electrode terminal 4b of the circuit board 4 via the reception-side FPC 6.

The circuit board 4 is a multilayer board having a thickness of about 50 μm. On the front surface of the circuit board 4, a drive circuit and signal processing circuit on the transmission side of the single-fiber bidirectional optical transmission/reception device 30 are set, and, on the rear surface, a drive circuit and signal processing circuit on the reception side of the single-fiber bidirectional optical transmission/reception device 30 are set. The drive circuit on the transmission side is an IC (Integrated Circuit) to drive a light-emitting element such as an LD, and the drive circuit on the reception side is an IC to drive a light-receiving element such as a PD. The signal processing circuits are circuits to process an electric signal supplied to the single-fiber bidirectional optical transmission/reception device 30 and an electric signal output from the single-fiber bidirectional optical transmission/reception device 30.

Figure 2:
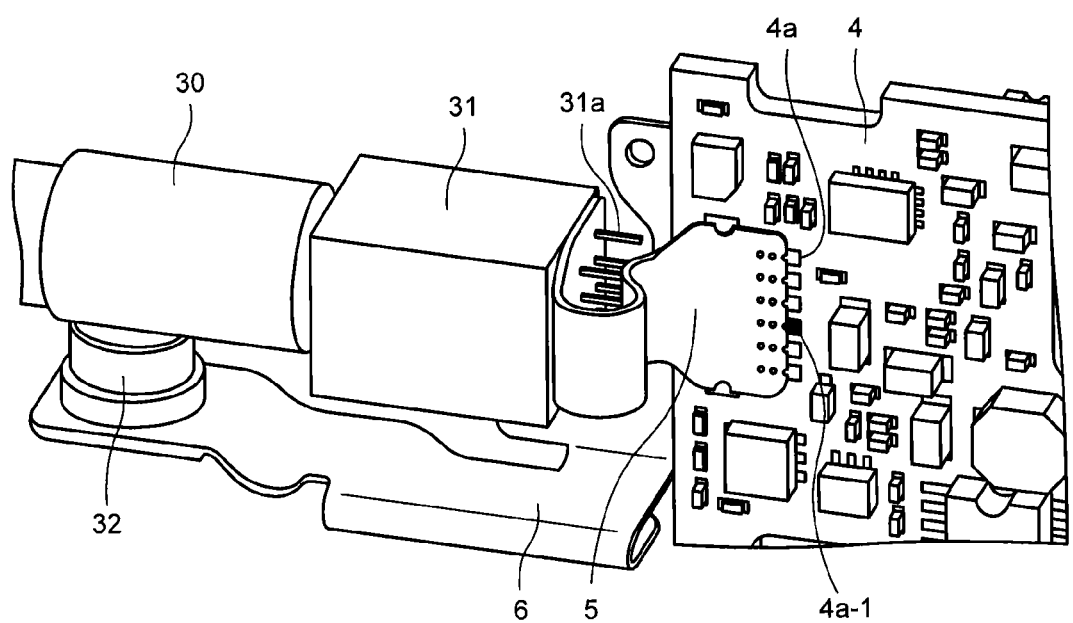
FIG. 2 is an enlarged perspective view illustrating a state where a single-fiber bidirectional optical transmission/reception device and a circuit board are connected by FPC's.

One end of the transmission-side FPC 5 engages with the LD stem 31 and the other end engages with the circuit board 4. One end of the reception-side FPC 6 engages with the PD stem 32 and the other engages with the circuit board 4. FIG. 2 is an enlarged perspective view illustrating a state where the single-fiber bidirectional optical transmission/reception device 30 and the circuit board 4 are connected by the FPC's 5 and 6. As illustrated in FIG. 2, the single-fiber bidirectional optical transmission/reception device 30 and the circuit board 4 are integrated through the transmission-side FPC 5 and the reception-side FPC 6. On the front surface of the reception-side FPC 6, a micro-strip line 6a is formed as a wiring pattern to electrically connect the reception-side lead terminal 32a and the reception-side electrode terminal 4b. In the micro-strip line 6a, a signal impedance-matched to 50Ω is transmitted. Also, in the rear surface of the reception-side FPC 6, a ground pattern is formed. Accordingly, SG (Signal Ground) with the micro-strip line 6a on the front surface is intended.

The separation wall 7 is formed between the transmission-side FPC 5 and the reception-side FPC 6. Similar to the chassis 2, for example, the separation wall 7 is formed with a stainless steel plate in which zinc plating or nickel plating is applied to the front surface, and has the same electric potential as that of the chassis 2. The separation wall 7 has a predetermined width, height and depth so as to be able to suppress a crosstalk caused between the transmission-side lead terminal 31a and the reception-side lead terminal 32a. In the present embodiment, although the separation wall 7 has the same height as that of the circuit board 4, it is not limited to this, and a requirement is that it has the height reaching positions at which all the transmission-side lead terminal 31a and the reception-side lead terminal 32a are set. The width of the separation wall 7 is around 0.5 to 2 mm (e.g. 1 mm), the height is around 3 to 5 mm and the depth is around 5 to 15 mm. Also, although the separation wall 7 is formed integrally or separably with respect to the chassis 2, it is electrically connected to at least the chassis 2 for FG (Frame Ground) with respect to the chassis 2.

In the optical transceiver 1, a voltage of an electric signal to drive an LD is a relatively high voltage of around 2.5 V, and a large drive current is supplied from the circuit board 4 to the LD of the LD stem 31 via the transmission-side lead terminal 31a. Meanwhile, a voltage of an electric signal output from the PD of the PD stem 32 via the reception-side lead terminal 32a is around tens of mV to several μV, and an output current is a minute current.

Figure 3A:
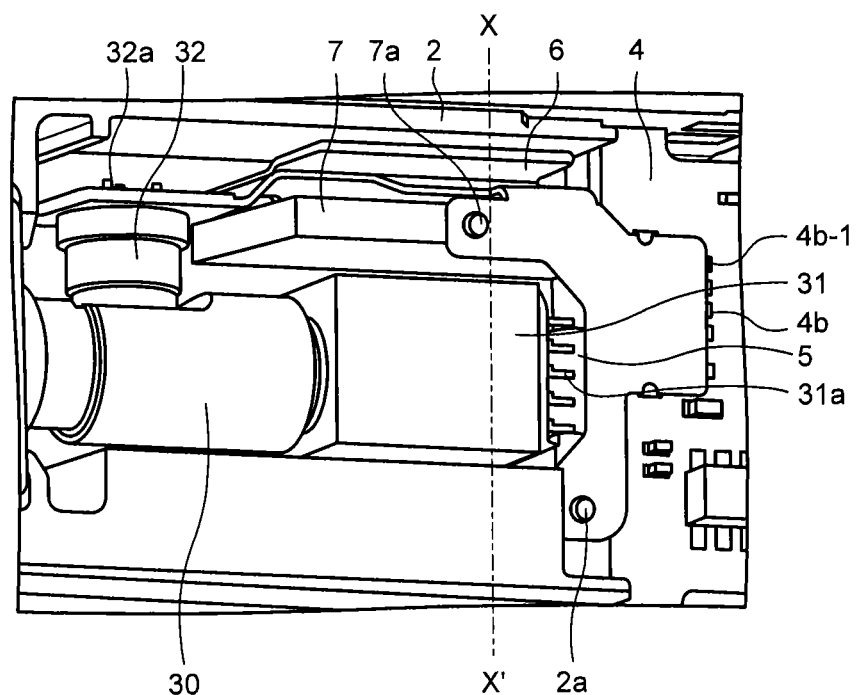
FIG. 3A is an enlarged perspective view illustrating a state where a separation wall is set between a transmission-side FPC and a reception-side FPC.

FIG. 3A is an enlarged perspective view illustrating a state where the separation wall 7 is set between the transmission-side FPC 5 and the reception-side FPC 6. As illustrated in FIG. 3A, the transmission-side lead terminal 31a of the LD stem 31 and the reception-side lead terminal 32a of the PD stem 32 are close to each other. Therefore, an electric or electromagnetic crosstalk may occur between the transmission-side lead terminal 31a in which a large drive current flows and the reception-side lead terminal 32a in which a minute current flows. If the crosstalk occurs, a noise is applied to a signal output from a photo diode to the circuit board 4 via the reception-side lead terminal 32a. Therefore, the separation wall 7 is set to reduce the crosstalk.

Figure 3B:
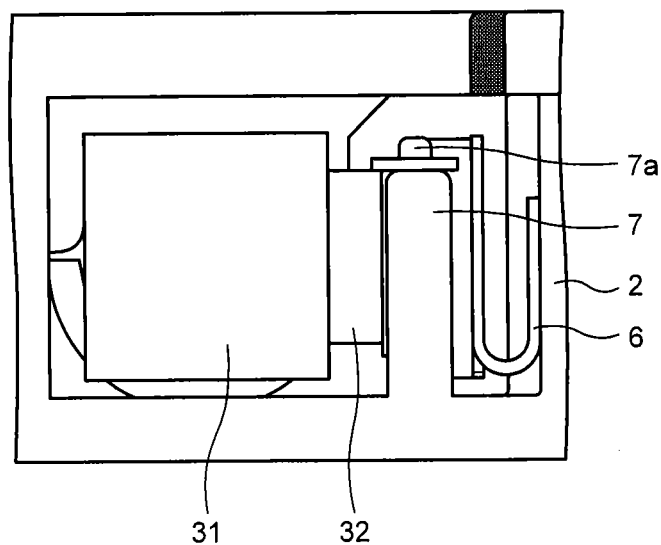
FIG. 3B is an X-X' cross-sectional view of an optical transceiver, which illustrates a state where a separation wall is set between a transmission-side FPC and a reception-side FPC.

FIG. 3B is an X-X' cross-sectional view of an optical transceiver, which illustrates a state where the separation wall 7 is set between the transmission-side FPC 5 and the reception-side FPC 6. As illustrated in FIG. 3B, the separation wall 7 shields between the transmission-side lead terminal 31a and the reception-side lead terminal 32a, and therefore the crosstalk is suppressed. Further, the reception-side FPC 6 is folded such that the front surface (i.e. signal wiring surface) is an inner side and the rear surface (i.e. signal ground surface) is an outer side, and the reception-side FPC 6 is set in a state where it is sandwiched between the chassis 2 and the separation wall 7. At this time, the front surface of the reception-side FPC 6 forms a space between a surface on the side of the separation wall 7 on which the micro-strip line 6a is formed and a surface on the side of the chassis 2 facing the above surface.

Also, as illustrated in FIG. 3B, the reception-side FPC 6 is folded such that the horizontal cross-sectional surface forms a horseshoe shape, and therefore the elastic force is generated in the outer direction (i.e. direction distancing the chassis 2 and the separation wall 7). The micro-strip line 6a having a characteristic impedance of 50Ω is formed on the front surface (i.e. inner side) of the reception-side FPC 6, and therefore a predetermined space is always maintained between the micro-strip line 6a and the chassis 2. Therefore, even if the reception-side FPC 6 is flexibly formed, the micro-strip line 6a is always separated from a wall surface of the chassis 2 and they are not touched to each other. That is, the micro-strip line 6a is reliably prevented from touching the chassis 2. Since the characteristic impedance changes due to the touch of the micro-strip line (i.e. wiring pattern) with respect to the chassis, by preventing this touch, impedance on a transmission line is maintained to 50Ω which is a matched predetermined value. Accordingly, degradation of the transmission characteristic of signals flown in the line is reduced. Therefore, even in high frequency of around 10 Gbps, stable optical transmission is realized. As a result, optical transmission quality is improved.

Figure 4A:
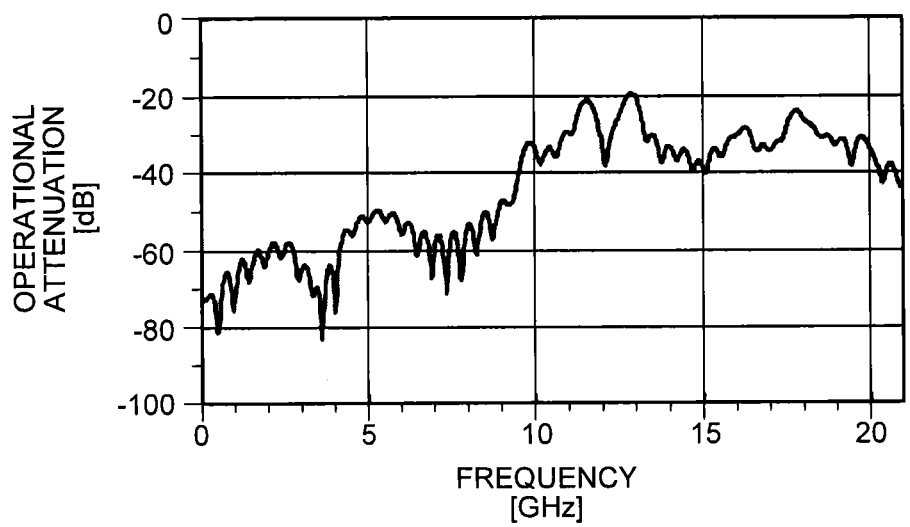
FIG. 4A is a view illustrating a relationship between frequency and operational attenuation in an optical transceiver in the related art.
Figure 4B:
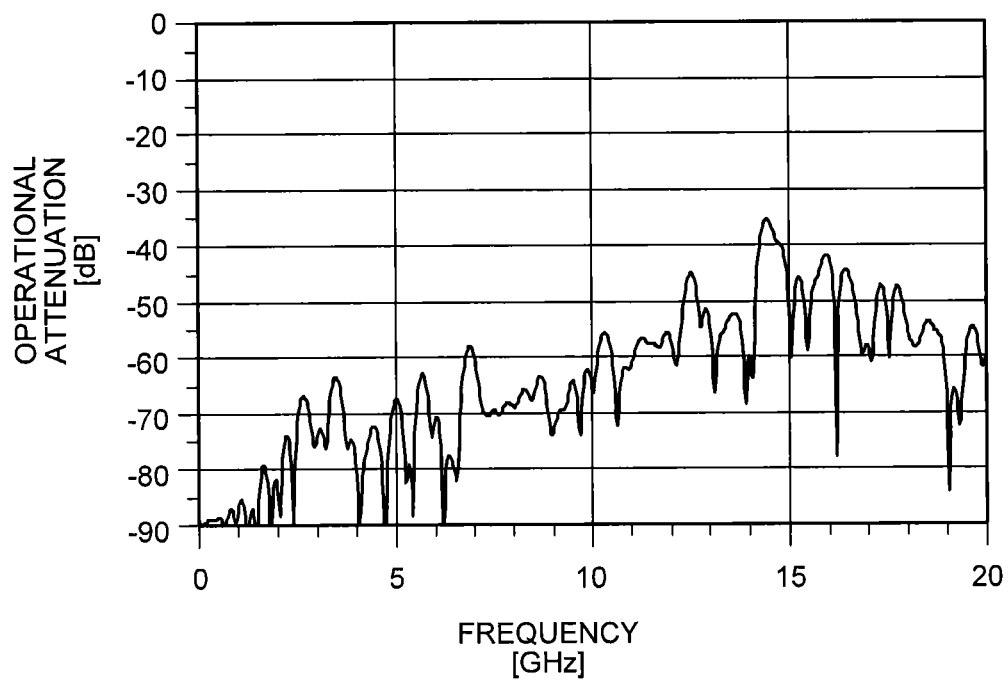
FIG. 4B is a view illustrating a relationship between frequency and operational attenuation in the optical transceiver according to the present embodiment.

FIG. 4A is a view illustrating a relationship between frequency and operational attenuation in an optical transceiver in the related art. FIG. 4B is a view illustrating a relationship between frequency and operational attenuation in the optical transceiver 1 according to the present embodiment. In FIG. 4A and FIG. 4B, the frequency (whose unit is GHz) is defined in the x axis direction and the operational attenuation (whose unit is dB) is defined in the y axis direction. It is represented that, as the operational attenuation has a smaller value, the robustness (i.e. isolation) to the crosstalk is higher, that is, the optical transceiver 1 can support a higher gain (i.e. ratio of a transmission signal to a reception signal). As a measurement condition of the operational attenuation, in the optical transceiver 1 according to the present embodiment, a third closest terminal 4a-1 (i.e. black-filled part in FIG. 2) to the reception-side FPC 6 among six transmission-side electrode terminals 4a and a terminal 4b-1 (i.e. black-filled part in FIG. 3A) closest to the separation wall 7 among five reception-side electrode terminals 4b are used for measurement targets with respect to the above gain. Even in an optical transceiver in the related art, similar to the present embodiment, the electrode terminals in the same positions (i.e. the third terminal from the bottom and the first terminal from the top) are selected as measurement terminals of the above gain to maintain fairness and ensure the reliability of a comparison result.

In FIG. 4A, although the attenuation indicates a relatively low value of about −70 dB at a low frequency of 1 GHz, it rapidly increases at around 8 GHz and has a high value of about −40 dB at a high frequency of 10 GHz. After that, the operational attenuation maintains a high value until the frequency passes 20 GHz. Therefore, it is difficult for an optical transceiver in the related art to support the high frequency. By contrast with this, in FIG. 4B, the operational attenuation is reduced regardless of the frequency. For example, it has a value of about −67 dB at a frequency of 5 GHz. Especially, it has a value of about −64 dB at a frequency of 10 GHz, that is, the operational attenuation is improved by 20 dB or more. Also, even if the frequency exceeds 10 GHz, the operational attenuation does not rapidly increase and a value below −35 dB is always maintained. Thus, by comparing FIG. 4A and FIG. 4B, it is found that the optical transceiver 1 according to the present embodiment can support a high frequency including 10 Gbps realized by the XGPON scheme.

Figure 5A:
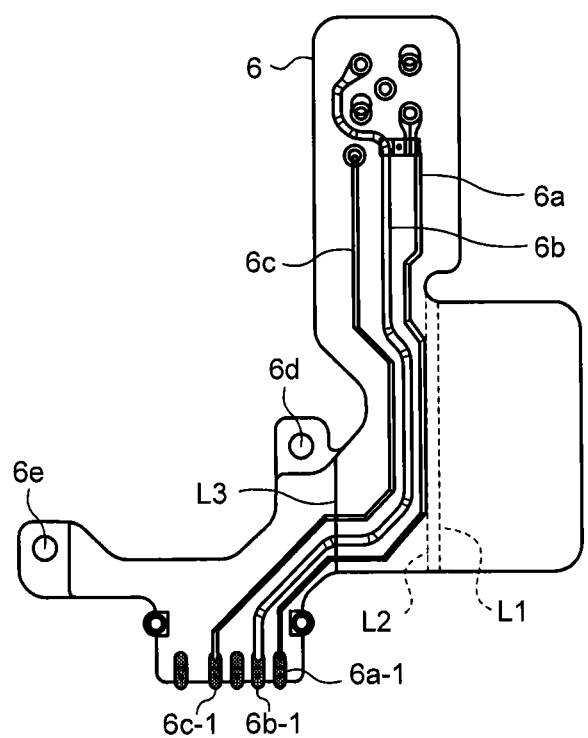
FIG. 5A is a front surface view in a case where the reception-side FPC is developed.

Next, a production method for the optical transceiver 1 will be explained with reference to FIG. 5A to FIG. 7B. FIG. 5A is a front surface view in a case where the reception-side FPC 6 is developed. The reception-side FPC 6 is a signal surface, and, in the front surface, as illustrated in FIG. 5A, the micro-strip line 6a, a power supply pattern 6b and a reset signal pattern 6c are formed in parallel. The micro-strip line 6a is an impedance matching wiring pattern of a characteristic impedance of 50Ω, which is formed to suppress signal reflection or transmission loss. Although the micro-strip line 6a is about 0.1 mm, it adopts a right-edge-side route of a short wiring distance to reduce a crosstalk as much as possible.

Also, in the vicinity of the central part and the left-edge part of the reception-side FPC 6, through-holes 6d and 6e to fix the reception-side FPC 6 to the chassis 2 and the separation wall 7 are formed. The diameters of the through-holes 6d and 6e are around 0.8 mm. Further, in the lower edge parts of the line 6a and the patterns 6b and 6c, lands 6a-1, 6b-1 and 6c-1 for solder joint to the reception-side electrode terminal 4b of the circuit board 4 are formed, respectively.

Also, in the reception-side FPC 6, two valley fold lines L1 and L2 are recorded as landmarks at the time of folding the reception-side FPC 6 into a horseshoe shape. Similarly, in the reception-side FPC 6, a mountain fold line L3 is recorded as a landmark at the time of jointing part of the reception-side FPC 6 to the circuit board 4.

Figure 5B:
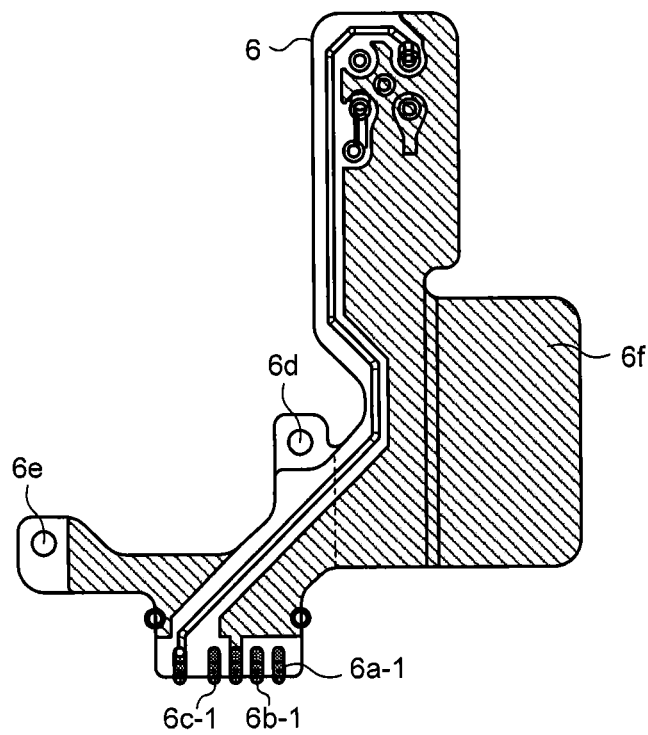
FIG. 5B is a rear surface view in a case where the reception-side FPC is developed.

FIG. 5B is a rear surface view in a case where the reception-side FPC 6 is developed. As illustrated in FIG. 5B, in the substantially whole surface of the rear surface of the reception-side FPC 6, an SG pattern 6f for signal ground is formed as a sold pattern. In FIG. 5B, a part with diagonal lines is the signal ground pattern 6f. The reception-side FPC 6 is formed with, for example, polyimide, and the signal ground pattern 6f is formed with, for example, copper.

Figure 6A:
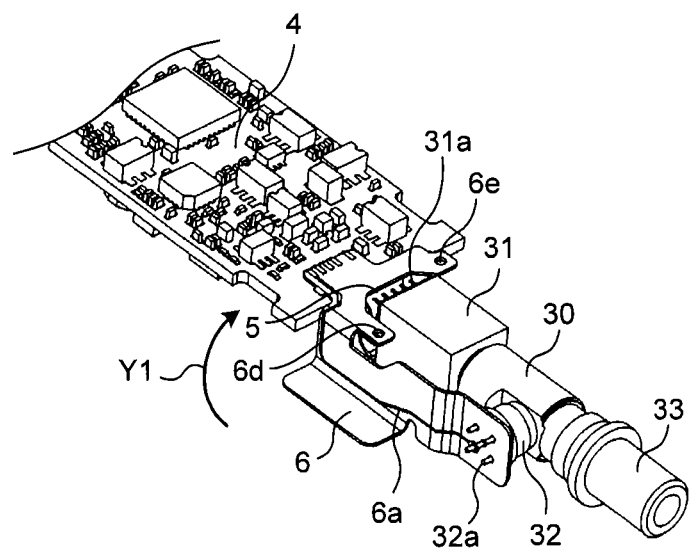
FIG. 6A is an enlarged perspective view illustrating a state before the reception-side FPC is folded.

FIG. 6A is an enlarged perspective view illustrating a state before the reception-side FPC 6 is folded. As illustrated in FIG. 6A, the reception-side FPC 6 is mounted so as to be interjacent to the single-fiber bidirectional optical transmission/reception device 30 and the circuit board 4. The reception-side lead terminal 32a is inserted in a lead hole formed in the reception-side FPC 6 and the micro-strip line 6a is formed, as a transmission line, on the front surface of the reception-side FPC 6 from the reception-side lead terminal 32a to the reception-side electrode terminal 4b. Also, in the front surface of the reception-side FPC 6, although the power supply pattern 6b and the reset signal pattern 6c are similarly formed so as to be parallel to the micro-strip line 6a, FIG. 6A illustrates, as representative, only the micro-strip line 6a having a large influence on a crosstalk or characteristic impedance.

The reception-side FPC 6 includes a through-hole corresponding to the reception-side lead terminal 32a extending from the PD stem 32. The reception-side lead terminal 32a is inserted in the through-hole in the reception-side FPC 6 and, as illustrated in FIG. 6A, the front edge of the reception-side lead terminal 32a is solder-jointed to the micro-strip line 6a of the reception-side FPC 6 in a state where the front edge of the reception-side lead terminal 32a projects from the reception-side FPC 6. The reception-side lead terminal 32a extending from the PD stem 32 is taken by the 50Ω matching pattern formed in the reception-side FPC 6 and connected to the reception-side electrode terminal 4b formed on the rear surface of the circuit board 4 via a land. In the rear surface of the circuit board 4, electronic components such as a drive circuit and signal processing circuit of a PD are mounted.

Meanwhile, in the front surface of the circuit board 4, electronic components such as a drive circuit and signal processing circuit of an LD are mounted. The transmission-side lead terminal 31a extending from the LD stem 31 is connected to the transmission-side electrode terminal 4a formed on the front surface of the circuit board 4 via the transmission-side FPC 5. Also, a current of relatively large amplitude flows in a circuit related to the LD and therefore is not weaker to noise than a circuit related to the PD. Therefore, the transmission-side lead terminal 31a extending from the LD stem 31 may be directly connected to the transmission-side electrode terminal 4a of the circuit board 4 not via the transmission-side FPC 5.

An optical transceiver includes a single-fiber bidirectional optical transmission/reception device, a circuit board, a transmission-side FPC, a reception-side FPC and a separation wall. The single-fiber bidirectional optical transmission/reception device includes an LD stem that converts an electric signal into an optical signal and transmits it, and a PD stem that receives the optical signal and converts it into an electric signal. The transmission-side FPC electrically connects the LD stem and the circuit board. The reception-side FPC electrically connects the PD stem and the circuit board. The separation wall is formed between the transmission-side FPC and the reception-side FPC, and grounded to the chassis of the optical transceiver. The reception-side FPC is folded and set between the chassis and the separation wall such that the board front surface is an inner side, where the micro-strip line is formed on the above board front surface.

A via-hole to connect intermediate layers of the front surface and the rear surface is formed in the circuit board 4. The via-hole is made by plating the inner surface of a through-hole formed through the circuit board 4. Also, as a via-hole, instead of a through-hole, a so-called IVH (Inner Via Hole) may be used, which is made by plating the inner surface of a hole having a depth halfway to the circuit board 4.

Figure 6B:
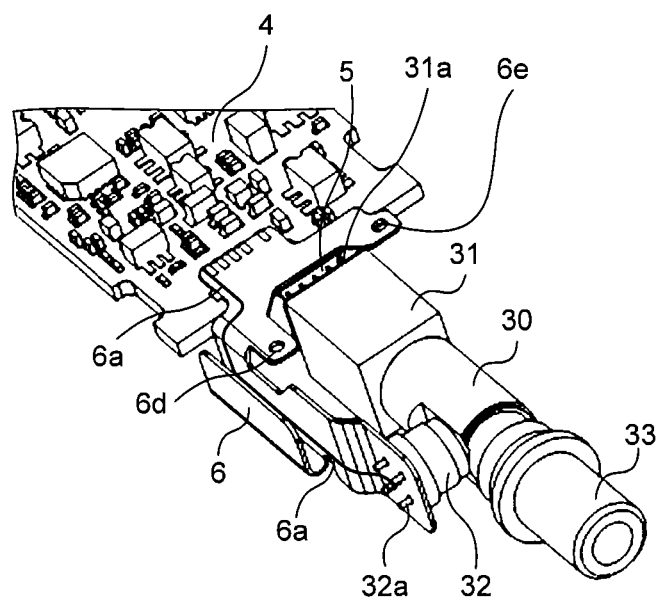
FIG. 6B is an enlarged perspective view illustrating a state after the reception-side FPC is folded.

In the reception-side FPC 6, a part set between the chassis 2 and the separation wall 7 is folded into a horseshoe shape in a direction indicated by arrow Y1 with respect to the valley fold lines L1 and L2 illustrated in FIG. 5A, such that the board front surface is an inner surface. FIG. 6B is an enlarged perspective view illustrating a state after the reception-side FPC 6 is folded. A fold portion of the reception-side FPC 6 is vertically inserted between a wall surface of the chassis 2 and the separation wall 7, using the elasticity, in a state where it is slightly opened. The fold portion of the reception-side FPC 6 is folded such that its front surface is an inner side, and therefore one rear surface of the fold portion faces the chassis 2 and the other rear surface faces the separation wall 7. In a case where the reception-side FPC 6 is fixed to the separation wall 7 without the fold, since the reception-side FPC 6 has flexibility, a signal surface of the reception-side FPC 6 may touch the chassis 2 due to some factor such as vibration and impact. Therefore, by folding the signal surface (i.e. front surface) of the reception-side FPC 6 inward, the rear surface side of the surface facing the signal surface is made close to the chassis 2. Accordingly, it is possible to reliably prevent the signal surface in which the micro-strip line 6a is wired, from touching the chassis 2.

Figure 7A:
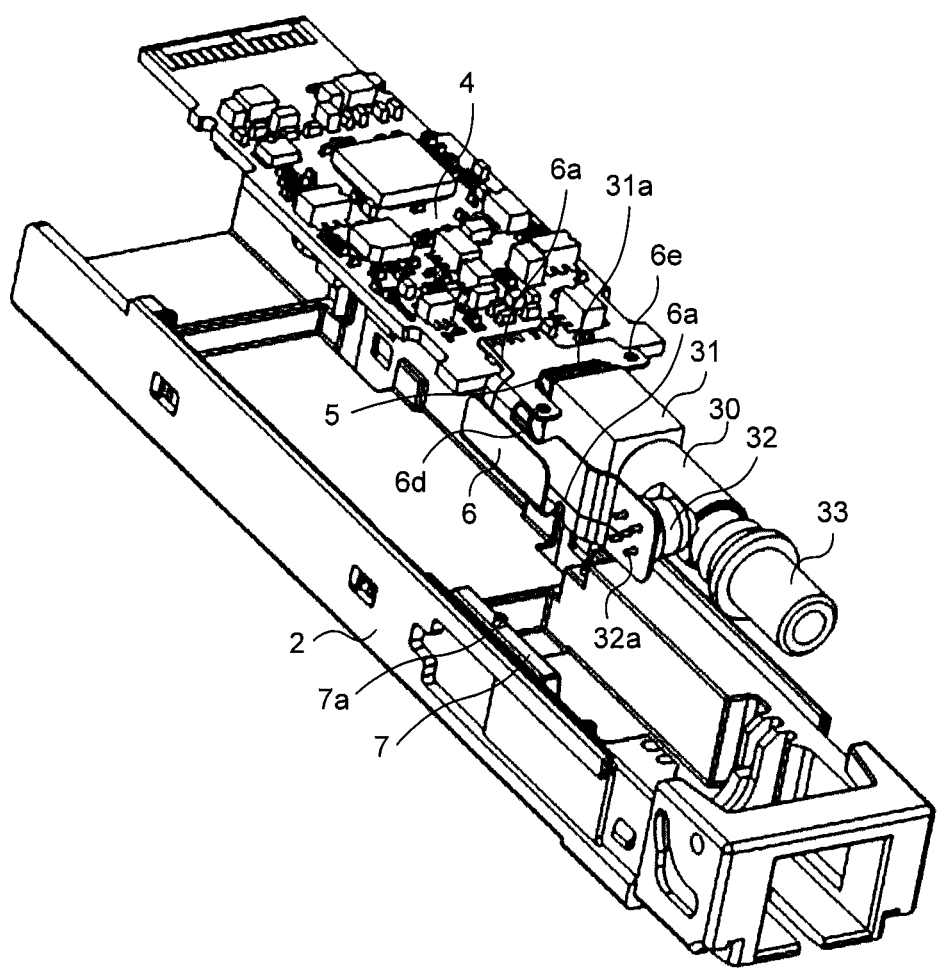
FIG. 7A is an enlarged perspective view of an optical transceiver before being attached to a chassis.

FIG. 7A is an enlarged perspective view of the optical transceiver 1 before being attached to a chassis. As illustrated in FIG. 7A, the folded part of the reception-side FPC 6 is sandwiched between the chassis 2 and the separation wall 7, and the reception-side FPC 6 is contained in the chassis 2 such that the separation wall 7 is set between the transmission-side FPC 5 and the reception-side FPC 6. After that, a convex portion 7a of the separation wall 7 and a convex portion 2a of the chassis 2 are inserted in the through-holes 6d and 6e, respectively, and solder-jointed. Accordingly, the reception-side FPC 6 is reliably fixed between the chassis 2 and the separation wall 7. Therefore, it is possible to prevent the micro-strip line 6a of the board front surface of the reception-side FPC 6 from approaching or touching the chassis due to vibration or impact more reliably. Also, copper plating is applied to the inner surfaces of the through-holes 6d and 6e, and, at the time of solder joint from the front surface of the reception-side FPC 6, the solder is likely to flow from the front surface side to the rear surface side.

Figure 7B:
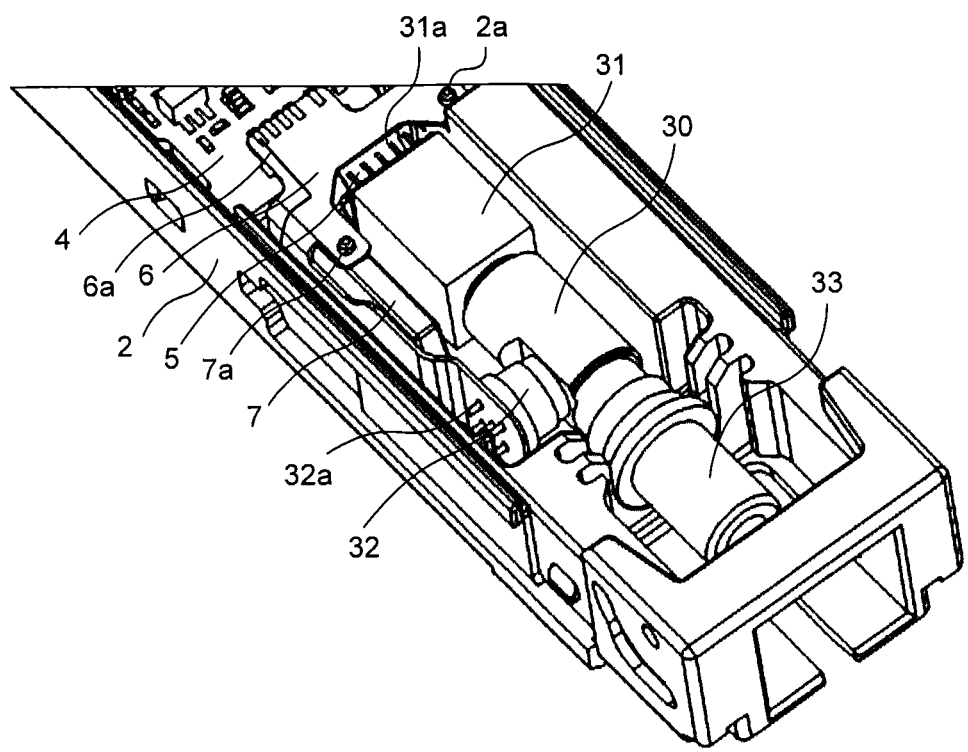
FIG. 7B is an enlarged perspective view of an optical transceiver after being attached to the chassis.

FIG. 7B is an enlarged perspective view of the optical transceiver 1 after being attached to the chassis. As illustrated in FIG. 7B, the reception-side FPC 6 is folded into a horseshoe shape and inserted between the wall surface of the chassis 2 and the separation wall 7. Accordingly, the optical transceiver 1 forcibly separates the signal surface and a metal wall, using the elasticity of an inner layer of the flexible board. Also, at the time of fitting the fiber bidirectional optical transmission/reception device 30 to the chassis 2, a simple method is employed in which the reception-side FPC 6 is folded and inserted between walls, and therefore it is possible to maintain a matched impedance at low cost.

Also, although the circuit board 4 is fixed to the chassis 2 by a fastening screw, the fastening screw portion is a board part of the circuit board 4, and therefore electrical conduction is not possible in the fastening screw portion. Also, the chassis 2 and the separation wall 7 made from metal are electrically connected to the signal ground (SG) surface of the reception-side FPC 6 and thereby a ground potential is held.

As described above, the optical transceiver 1 includes the single-fiber bidirectional optical transmission/reception device 30, the circuit board 4, the transmission-side FPC 5, the reception-side FPC 6 and the separation wall 7. The single-fiber bidirectional optical transmission/reception device 30 includes the LD stem 31 that converts an electric signal into an optical signal and transmits it, and the PD stem 32 that receives the optical signal and converts it into an electric signal. The circuit board 4 includes the drive circuit and signal processing circuit of the single-fiber bidirectional optical transmission/reception device 30. The transmission-side FPC 5 electrically connects the LD stem 31 and the circuit board 4. The reception-side FPC 6 electrically connects the PD stem 32 and the circuit board 4. The separation wall 7 is formed between the transmission-side FPC 5 and the reception-side FPC 6, and subjected to frame ground (FG) with respect to the chassis 2 of the optical transceiver 1. The reception-side FPC 6 is folded and set between the chassis 2 and the separation wall 7 such that the board front surface is an inner side, where the micro-strip line 6*a* is formed on the above board front surface and the signal ground (SG) pattern 6*f* is formed on the rear surface.

That is, the optical transceiver 1 according to the present embodiment shields a transmission signal of around 2.5 V and a reception signal of around 10 mV by the separation wall 7 subjected to chassis ground, in order to reduce a crosstalk between the reception-side circuit and the transmission-side circuit. Further, since the reception-side FPC 6 is shifted from the vicinity of the side surface to the rear surface of the circuit board 4 when being connected to the circuit board 4, it becomes close to the wall surface of the chassis 2 and therefore a characteristic impedance held in the reception-side FPC 6 may degrade. To remove an influence on this characteristic impedance, the optical transceiver 1 employs a configuration of folding the reception-side FPC 6 into a horseshoe shape and inserting it between the wall surface of the chassis 2 and the separation wall 7, using the elasticity of a copper foil of the FPC. The reception-side FPC 6 has the elasticity and therefore has a characteristic of widening in the fold direction and the opposite direction. Therefore, the force in the direction of the side of the separation wall 7 acts on the micro-strip line 6*a* on the front surface of the reception-side FPC 6 and the force in the direction of the wall surface side of the chassis 2 acts on the front surface facing the micro-strip line 6*a*. Accordingly, the micro-strip line 6*a* is suppressed to approach the chassis 2. As a result, characteristic impedance degradation is suppressed.

In the following, modifications of the above embodiment will be explained with reference to FIG. 8 to FIG. 11.

Modification 1

Figure 8:
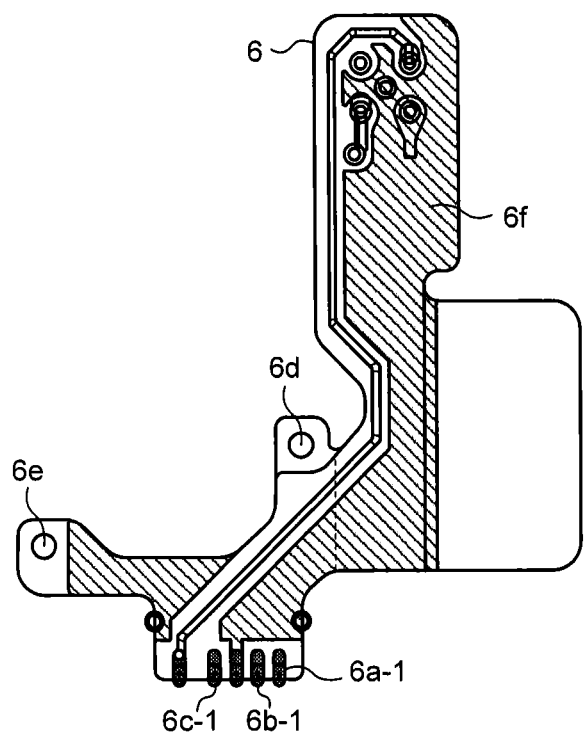
FIG. 8 is a rear surface view in a case where a reception-side FPC according to modification 1 is developed.

FIG. 8 is a rear surface view in a case where the reception-side FPC 6 according to modification 1 is developed. In the above embodiment, the signal ground pattern 6*f* is formed on the substantially whole rear surface including the fold portion of the reception-side FPC 6. However, as illustrated in FIG. 8, in the rear surface of the reception-side FPC 6, the fold portion may not be subjected to the signal ground pattern 6*f*. Accordingly, it is possible to easily increase the elasticity (i.e. spring action) of the reception-side FPC 6. Also, the portion from which the signal ground pattern 6*f* is removed does not have to be necessarily the entire of the fold portion but may be part of it. Further, the position and shape of this part can be adequately changed to adjust the elasticity depending on the position and shape.

Modification 2

Figure 9:
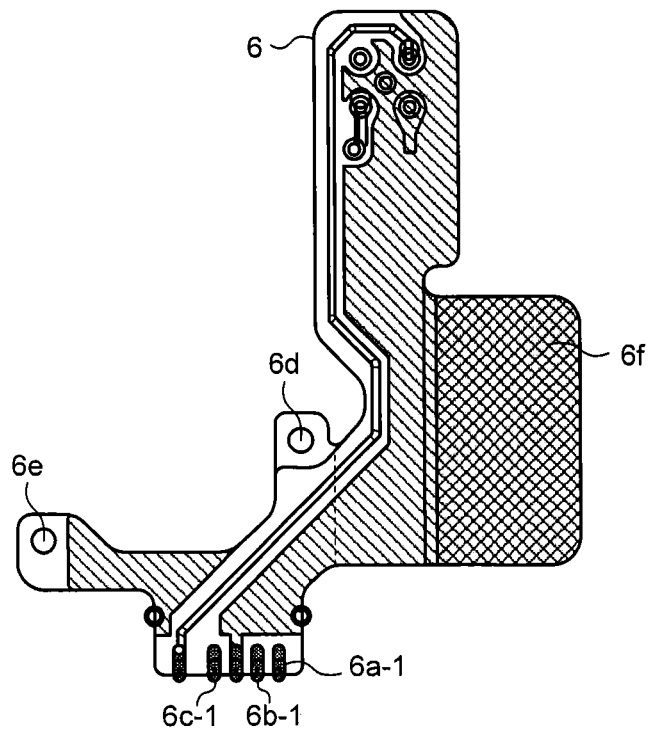
FIG. 9 is a rear surface view in a case where a reception-side FPC according to modification 2 is developed.

FIG. 9 is a rear surface view in a case where the reception-side FPC 6 according to modification 2 is developed. In the above embodiment, the signal ground pattern 6*f* is formed on the substantially whole rear surface including the fold portion of the reception-side FPC 6. However, in contradiction to modification 1, as illustrated in FIG. 9, a fold portion in the rear surface of the reception-side FPC 6 may be subjected to the mesh-shape signal ground pattern 6*f*. Even in this aspect, it is possible to easily adjust (or decrease) the elasticity of the reception-side FPC 6. Also, the portion in which the signal ground pattern 6*f* is mesh-processed does not have to be necessarily the entire of the fold portion but may be part of it. Further, the position and shape of this part can be adequately changed to adjust the elasticity depending on the position and shape.

Modification 3

Figure 10:
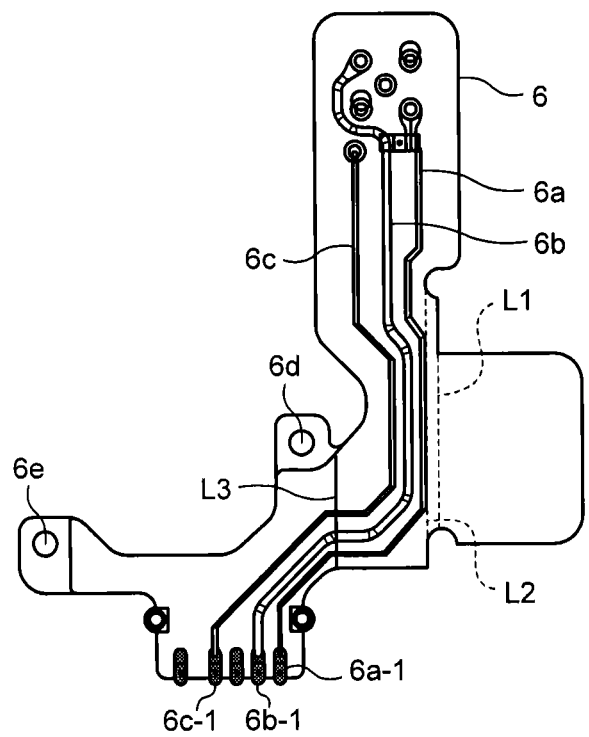
FIG. 10 is a front surface view in a case where a reception-side FPC according to modification 3 is developed.

The elasticity of the reception-side FPC 6 can be adjusted by not only a signal ground pattern but also a shape of a fold portion. FIG. 10 is a front surface view in a case where the reception-side FPC 6 according to modification 3 is developed. As illustrated in FIG. 10, the optical transceiver 1 may have the reception-side FPC 6 of a smaller area than the above embodiment. Accordingly, the distance of the valley fold line L1 illustrated by dash line in the figure becomes short and the elasticity of the reception-side FPC 6 is reduced. Therefore, according to this aspect, it is possible to easily adjust the elasticity of the reception-side FPC 6 without changing the signal ground pattern 6*f*. Also, the size change of the reception-side FPC 6 is not limited to shrinking but may be expanding. Similarly, the distance change of the valley fold line L1 is not limited to shrinking but may be expanding. Further, the change target of the fold part is not limited to the size but may be the shape or both of them. In other words, even by adequately changing the size or shape of the fold part, it is possible to adjust the elasticity of the reception-side FPC 6.

Modification 4

Figure 11:
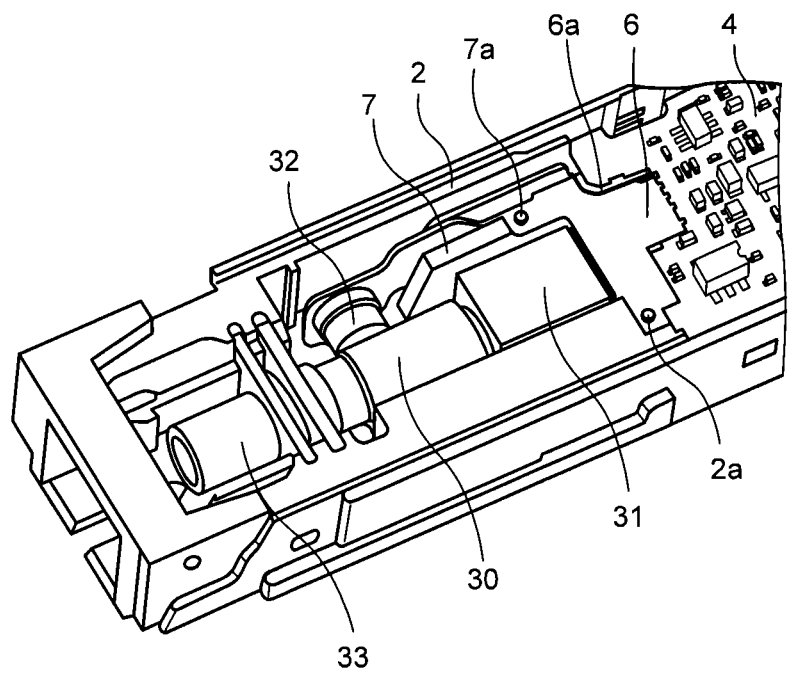
FIG. 11 is an enlarged perspective view illustrating a reception-side FPC according to modification 4.

FIG. 11 is an enlarged perspective view illustrating the reception-side FPC 6 according to modification 4. In the above embodiment, as illustrated in FIG. 3A, the transmission-side lead terminal 31*a* is not completely covered by the reception-side FPC 6 and part of it is exposed above. However, as illustrated in FIG. 11, the optical transceiver 1 can employ an aspect in which, by further extending the shape of the reception-side FPC 6 to the side of the LD stem 31, the reception-side FPC 6 covers the transmission-side lead terminal 31*a* and the transmission-side FPC 5 that are crosstalk sources. Accordingly, transmission electric signals are completely shielded by the reception-side FPC 6. Therefore, a crosstalk between a transmission electric signal and a reception electric signal is further improved. As a result, optical transmission quality is further improved.

Also, in the above embodiment, the micro-strip line 6*a* is formed on the side of the separation wall 7 (i.e. inward) in the front surface (i.e. signal surface) of the reception-side FPC 6, in view of a simple form of a wiring pattern or shrinking of a wiring distance. However, the micro-strip line 6*a* may be formed on the wall side of the chassis 2 (i.e. outward). Also, the micro-strip line 6*a* is not limitedly formed on a single surface but may be formed on both surfaces.

Also, in the above embodiment, although the reception-side FPC 6 is fixed to two places of the chassis 2 and the separation wall 7 by the fixing holes and the convex portions, it may be fixed to one place, three places or more.

According to an aspect of an optical transceiver disclosed in the present application, it is possible to suppress a crosstalk between transmission and reception in single-fiber bidirectional transmission and maintain a predetermined impedance.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An optical transceiver comprising:
an optical transmission/reception device including a light emitting unit that converts an electric signal into an optical signal and transmits the optical signal, and a light receiving unit that receives a second optical signal and converts the second optical signal into an electric signal;
a circuit board including a drive circuit and a signal processing circuit of the optical transmission/reception device;
a first flexible printed circuit that electrically connects the light emitting unit and the circuit board;
a second flexible printed circuit that electrically connects the light receiving unit and the circuit board; and
a separation wall that is formed between the first flexible printed circuit and the second flexible printed circuit and grounded to a chassis of the optical transceiver, wherein
the second flexible printed circuit is folded and set between the chassis and the separation wall such that a board front surface is an inner side, and a wiring pattern is formed on the board front surface and a signal ground pattern is formed on a rear surface.

2. The optical transceiver according to claim 1, wherein the wiring pattern is formed on the board front surface on a side of the separation wall in a folded part of the second flexible printed circuit.

3. The optical transceiver according to claim 1, wherein the second flexible printed circuit is formed so as to cover both the first flexible printed circuit and a lead terminal connected to the light emitting unit.

4. The optical transceiver according to claim 1, wherein a fixing hole is formed on the second flexible printed circuit and a convex portion formed on the separation wall is inserted to the fixing hole and solder-jointed.

5. A production method for an optical transceiver, the method comprising:
first forming an optical transmission/reception device including a light emitting unit that converts an electric signal into an optical signal and transmits the optical signal and a light receiving unit that receives a second optical signal and converts the second optical signal into an electric signal;
second forming a circuit board including a drive circuit and a signal processing circuit of the optical transmission/reception device;
third forming a first flexible printed circuit that electrically connects the light emitting unit and the circuit board;
fourth forming a second flexible printed circuit that electrically connects the light receiving unit and the circuit board;
fifth forming a chassis including a separation wall grounded to the chassis;
folding a part set between the chassis and the separation wall in the second flexible printed circuit such that a board front surface is an inner side; and
inserting a folded part of the second flexible printed circuit between the chassis and the separation wall and containing the second flexible printed circuit in the chassis such that the separation wall is set between the first flexible printed circuit and the second flexible printed circuit.

6. The production method for the optical transceiver according to claim 5, the method further comprising sixth forming a wiring pattern on the board front surface on a side of the separation wall in the folded part of the second flexible printed circuit.

* * * * *